United States Patent
Tsai et al.

(10) Patent No.: US 11,232,992 B2
(45) Date of Patent: Jan. 25, 2022

(54) POWER DEVICE PACKAGE STRUCTURE

(71) Applicant: ACTRON TECHNOLOGY CORPORATION, Taoyuan (TW)

(72) Inventors: Hsin-Chang Tsai, Taoyuan (TW); Ching-Wen Liu, Taoyuan (TW)

(73) Assignee: ACTRON TECHNOLOGY CORPORATION, Taoyuan (TW)

(*) Notice: Subject to any disclaimer, the term of this patent is extended or adjusted under 35 U.S.C. 154(b) by 64 days.

(21) Appl. No.: 16/124,199

(22) Filed: Sep. 7, 2018

(65) Prior Publication Data

US 2019/0393111 A1    Dec. 26, 2019

(30) Foreign Application Priority Data

Jun. 25, 2018 (TW) ................................. 107121672

(51) Int. Cl.
*H01L 23/28* (2006.01)
*H01L 23/532* (2006.01)
*H01L 23/373* (2006.01)

(52) U.S. Cl.
CPC ............ *H01L 23/28* (2013.01); *H01L 23/373* (2013.01); *H01L 23/53233* (2013.01); *H01L 23/53242* (2013.01); *H01L 23/53257* (2013.01)

(58) Field of Classification Search
CPC ...... H01L 23/373–3738; H01L 23/3171–3178
See application file for complete search history.

(56) References Cited

U.S. PATENT DOCUMENTS

| 7,405,467 B2 | 7/2008 | Liu et al. | |
| 2010/0117216 A1* | 5/2010 | Lu | H01L 23/36 257/692 |
| 2012/0061775 A1* | 3/2012 | Kim | B60C 23/0408 257/415 |
| 2013/0105956 A1* | 5/2013 | Jo | H01L 23/49531 257/676 |
| 2014/0284797 A1* | 9/2014 | Hisazato | H01L 23/3735 257/741 |

(Continued)

FOREIGN PATENT DOCUMENTS

| CN | 1748306 | 3/2006 |
| CN | 1893061 | 1/2007 |

(Continued)

OTHER PUBLICATIONS

"Office Action of Taiwan Counterpart Application," dated Mar. 27, 2019, p. 1-p. 7.

(Continued)

*Primary Examiner* — Dale E Page
*Assistant Examiner* — Wilner Jean Baptiste
(74) *Attorney, Agent, or Firm* — JCIPRNET

(57) ABSTRACT

A power device package structure including a first substrate, a second substrate, at least one power device, and a package is provided. A heat conductivity of the first substrate is greater than 200 Wm$^{-1}$K$^{-1}$. The power device is disposed on the first substrate, and the second substrate is disposed under the first substrate. A heat capacity of the second substrate is greater than that of the first substrate. The package encapsulates the first substrate, the second substrate, and the power device.

9 Claims, 4 Drawing Sheets

(56) References Cited

U.S. PATENT DOCUMENTS

2015/0085454 A1* 3/2015 Hong .................. H01L 23/4334
361/761

FOREIGN PATENT DOCUMENTS

| CN | 101800208 | 8/2010 |
|----|-----------|--------|
| EP | 2065934 | 6/2009 |
| TW | 201216382 | 4/2012 |
| TW | M508801 | 9/2015 |

OTHER PUBLICATIONS

"Office Action of China Counterpart Application", dated Mar. 23, 2021, p. 1-p. 6.

* cited by examiner

POWER DEVICE PACKAGE STRUCTURE

CROSS-REFERENCE TO RELATED APPLICATION

This application claims the priority benefits of Taiwan application serial no. 107121672, filed on Jun. 25, 2018. The entirety of the above-mentioned patent application is hereby incorporated by reference herein and made a part of this specification.

BACKGROUND

Technical Field

The disclosure is related to a package structure and more particularly, to a power device package structure.

Description of Related Art

A power device package structure can be applied to a rectifier, a vehicle generator or a high-power module generator. In the technical field of vehicle generators, a rectifier bridge is commonly disposed for AC-DC conversion. The rectifier bridge may be composed of power devices and configured to provide a rectified voltage as a basis for driving a load.

When the load of the generator is transiently removed, a so-called load dump phenomenon occurs. When the load dump phenomenon occurs, a voltage amplitude is transiently changed, and a high heat is transiently generated to the power devices, such that a junction temperature of the power devices rises in a transient time, which may result in damage of the power device package structure.

However, most of the designs of the current power device package structure aim at reducing the thermal resistance of the package structure used in a steady state, i.e., reducing the steady-state thermal resistance of the package structure. However, there is no proper solution so far for reducing the transient-state thermal resistance related to the transient high heat.

SUMMARY

The disclosure provides a power device package structure capable of reducing not only a steady-state thermal resistance but also a transient-state thermal resistance for the power device package structure.

A power device package structure of the disclosure includes a first substrate, a second substrate, at least one power device, and a package. A heat conductivity of the first substrate is greater than 200 Wm$^{-1}$K$^{-1}$. The power device is disposed on the first substrate, the second substrate is disposed under the first substrate, and a heat capacity of the second substrate is greater than that of the first substrate. The package encapsulates the first substrate, the second substrate, and the power device.

In an embodiment of the disclosure, a material of the first substrate is selected from one of copper, aluminum, gold, silver, diamond or graphene and an alloy compound thereof.

In an embodiment of the disclosure, a material of the second substrate is selected from one of copper, aluminum, lithium, diamond or graphene and an alloy compound thereof.

In an embodiment of the disclosure, a thickness of the second substrate is greater than a thickness of the first substrate.

In an embodiment of the disclosure, a volume of the second substrate is greater than a volume of the first substrate.

In an embodiment of the disclosure, a projection area of the second substrate is smaller than or equal to a projection area of the package.

In an embodiment of the disclosure, the first substrate is made of copper and has a heat capacity greater than or equal to 0.5 J·$^{\circ}$C.$^{-1}$.

In an embodiment of the disclosure, the second substrate is made of aluminum and has a heat capacity greater than or equal to 1.43 J·$^{\circ}$C.$^{-1}$.

In an embodiment of the disclosure, a heat capacity of the second substrate is greater than or equal to 0.5 J·$^{\circ}$C.$^{-1}$.

In an embodiment of the disclosure, a part of the substrate and a part of the second substrate are exposed from the package.

In an embodiment of the disclosure, the second substrate is disposed directly under the power device.

In an embodiment of the disclosure, the first substrate is in direct contact with the second substrate.

In an embodiment of the disclosure, the power device package structure is a package structure for vehicle power device.

In an embodiment of the disclosure, the power device package structure further includes a control IC or a circuit device disposed on the first substrate.

Based on the above, in the disclosure, with the second substrate having the greater heat capacity arranged in pairs with the first substrate having high thermal conductivity, not only the steady-state thermal resistance but also the transient-state thermal resistance of the power device package structure can be reduced, so as to improve the capability of the package structure in processing transient-state loads, such as a load dump and a short circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1:
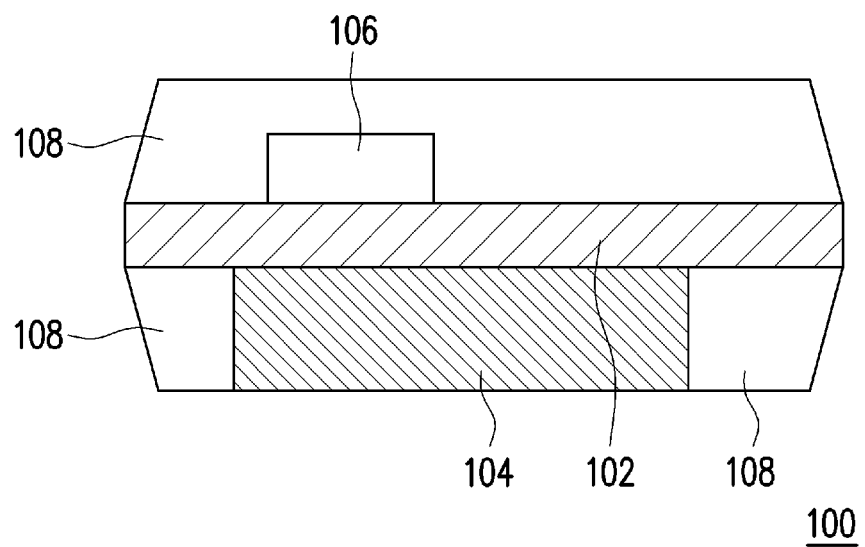
FIG. 1 is a schematic cross-sectional view of a power device package structure according to an embodiment of the disclosure.

A description accompanied with drawings is provided below. However, the disclosure may still be implemented in many other different forms and should not be construed as limitations to the embodiments described hereinafter. In the drawings, each area, each portion and a size and a thickness of each layer may not illustrated according to actual proportions. For convenient comprehension, the same elements are labeled by the same referral symbols in the following description.

FIG. 1 is a schematic cross-sectional view of a power device package structure according to an embodiment of the disclosure.

Referring to FIG. 1, a power device package structure 100 of the present embodiment includes a first substrate 102 having a thermal conductivity greater than 200 $Wm^{-1}K^{-1}$, a second substrate 104, at least one power device 106, and a package 108. A material of the first substrate 102 is a material having a high thermal conductivity and is, for example, selected from one of copper, aluminum, gold, silver, diamond, graphene and an alloy compound thereof. The power device 106 is disposed on the first substrate 102. The second substrate 104 is disposed under the first substrate 102 and the second substrate 104 is preferably disposed directly under the power device 106. In the present embodiment, a heat capacity of the second substrate 104 is greater than that of the first substrate 102 and is, for example, greater than or equal to 0.5 $J \cdot ° C.^{-1}$. A material of the second substrate 104 is a material having a high heat capacity, for example, selected from one of copper, aluminum, gold, silver, diamond, graphene and an alloy compound thereof preferably aluminum or an aluminum alloy. In an embodiment, the first substrate 102 is made of copper and has a heat capacity greater than or equal to 0.5 $J \cdot ° C.^{-1}$, and the second substrate 104 is made of aluminum and has a heat capacity greater than or equal to 1.43 $J \cdot ° C.^{-1}$.

In the present embodiment, the first substrate 102 may be in direct contact with the second substrate 104. In another embodiment, a conductive adhesive layer (not shown) may be disposed between the first substrate 102 and the second substrate 104. In an embodiment, a thickness of the second substrate 104 is greater than a thickness of the first substrate 102, and/or a volume of the second substrate 104 is greater than a volume of the first substrate 102. The package 108 encapsulates the first substrate 102, the second substrate 104, and the power device 106, wherein a part of the second substrate 104 and a part of the first substrate 102 may be exposed from the package 108, as illustrated in FIG. 1. A projection area of the second substrate 104 is, for example, smaller than or equal to a projection area of the package 108. In the present embodiment, a material of the package 108 is, for example, but not limited to, an epoxy resin, a silicone resin, unsaturated polyester or a ceramic material. The power device package structure 100 of the present embodiment may be a package structure for vehicle power device.

When the power device package structure 100 of the disclosure is applied to a rectifier of a vehicle generator, an AC current continuously enters the power device package structure 100 and is output after being converted into a DC current via the power device 106. The heat generated during the conversion causes the temperature of the power device 106 to rise, and thus, the first substrate 102 with the high heat conductivity provided in the present embodiment is capable of reducing a steady-state thermal resistance. The high heat generated by a surge voltage which is transiently generated after shutting down a load current may be quickly absorbed by the second substrate 104 having the high heat capacity provided by the present embodiment, so as to reduce a junction temperature of the power device 106.

For instance, for a vehicle generator provided with with 50 A power generation, a transient-state energy generated when a load dump phenomenon occurs to the vehicle generator is about 97.2 J, the heat capacity of the first substrate 102 of the present embodiment is designed to be 0.5 $J \cdot ° C.^{-1}$ in a scenario that a copper lead frame is employed as the first substrate 102, and an aluminum substrate is employed as the second substrate 104. In this scenario, the junction temperature of the power device 106 may be prevented from being greater than 350° C. as long as the heat capacity of the second substrate 104 is greater than that of the first substrate 102. Further, in the present embodiment, the heat capacity of the second substrate may be further designed to be 1.43 $J \cdot ° C.^{-1}$, thereby preventing the junction temperature of the power device 106 from being greater than 190° C. to protect the power device 106 from being damaged due to the excessively high junction temperature.

Figure 2A:
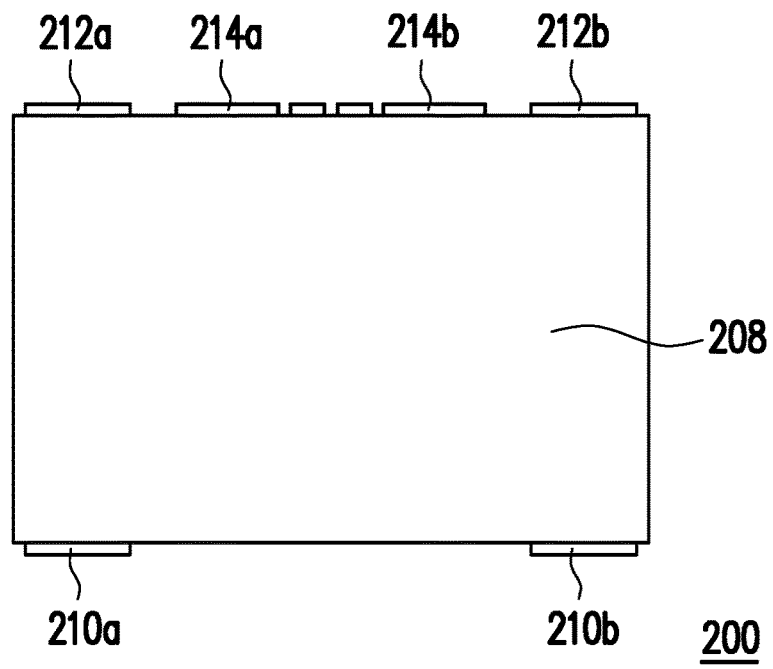
FIG. 2A is a schematic front view of a power device package structure according to another embodiment of the disclosure.
Figure 2B:
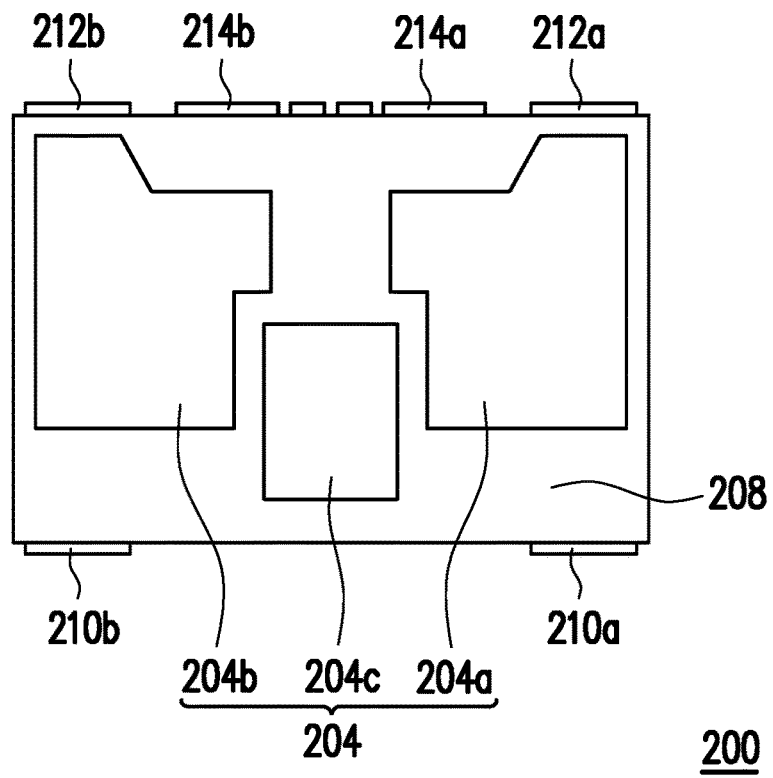
FIG. 2B is a schematic rear view of FIG. 2A.
Figure 3:
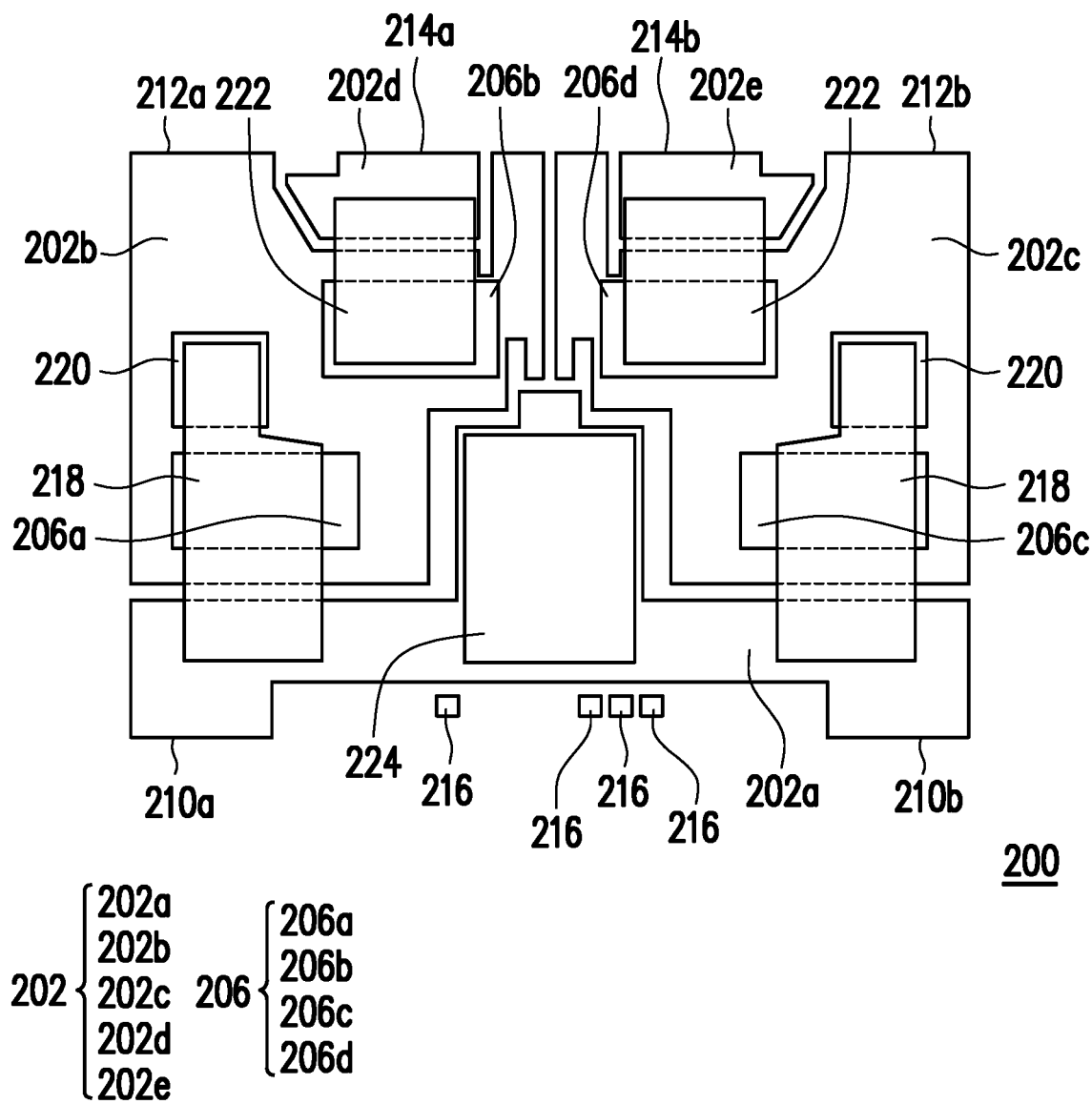
FIG. 3 is a perspective view of the power device package structure depicted in FIG. 2A.

FIG. 2A is a schematic front view of a power device package structure according to another embodiment of the disclosure. FIG. 2B is a schematic rear view of FIG. 2A. FIG. 3 is a perspective view of the power device package structure depicted in FIG. 2A, wherein a package is omitted for showing the front structure of a power device package structure more clearly.

Referring to FIG. 2A, FIG. 2B and FIG. 3 simultaneously, a power device package structure 200 of the present embodiment basically includes a first substrate 202 having a thermal conductivity greater than 200 $Wm^{-1}K^{-1}$, a second substrate 204, a power device 206 and a package 208. In the present embodiment, the first substrate 202 is, for example, a lead frame and is composed of a plurality of blocks 202a to 202e separated from one another, wherein the block 202a has reference ground pins 210a and 210b, the block 202b has a phase output pin 212a, the block 202c has a phase output pin 212b, the block 202d has a power pin 214a, and the block 202e has a power pin 214b. The power pins 214a and 214b may be coupled to a vehicle battery, the phase output pins 212a and 212b may respectively generate a plurality of rectified signals, and the reference ground pins 210a and 210b may be coupled to a reference ground terminal. When the package 208 encapsulates the first substrate 202, the second substrate 204 and the power device 206, the pins 210a, 210b, 212a, 212b, 214a and 214b may protrude from the package 208, as illustrated in FIG. 2A and FIG. 2B. The first substrate 202 may further include a plurality of pin blocks which are separated from the block 202a and are capable of being connected with the first substrate 202 or a device (e.g., the power device 206 or an external power) thereon via a wire, a copper clip or any other conductor. The selection of a material of the first substrate 202 in the present embodiment may refer to the previous embodiment and will not repeatedly described.

Continuously referring to FIG. 3, in the present embodiment, the power device 206 is disposed on the first substrate 202. The power device 206 includes, for example, power transistors 206a to 206d. The power transistors may include metal oxide semiconductor field effect transistors (MOSFETs) or other power transistors. In the present embodiment, the power transistors 206a to 206d are disposed respectively on different blocks of the first substrate 202, but the disclosure is not limited thereto. Taking FIG. 3 for example, the power transistors 206a and 206b are disposed on the block 202b of the first substrate 202, and the power transistors 206c and 206d are disposed on the block 202c of the first substrate 202. The power transistor 206a may be electrically connected with the blocks 202a and 202b via a conductive structure 218, and a Zener diode 220 may be additionally disposed on the block 202b and connected between a terminal (e.g., a drain) and another terminal (e.g., a source) of the power transistor 206a via the conductive structure 218 to serve as a protective device of the power transistor 206a, but the disclosure is not limited thereto. In another embodiment, due to the presence of the second substrate 204, the power transistor 206a may be directly electrically connected to the block 202b of the first substrate 202 via the conductive structure 218, without the Zener diode 220. The power transistor 206a may be electrically connected with the block 202d via a conductive structure 222.

The power transistor 206a may be electrically connected with the blocks 202a and 202c via another conductive structure 218 in the same way, and another Zener diode 220 may be additionally disposed on the block 202c and connected between a terminal (e.g., a drain) and another terminal (e.g., a source) of the power transistor 206c via the conductive structure 218 to serve as a protective device of the power transistor 206c. However, the disclosure is not limited thereto, the Zener diode 220 described above may also be omitted, and the issue caused by a transient-state thermal resistance may be directly solved via the second substrate 204, such that the power transistor 206c may be directly electrically connected to the block 202c of the first substrate 202 via the conductive structure 218. The power transistor 206d may be electrically connected with the block 202e via another conductive structure 222. The aforementioned conductive structures 218 and 222 are, for example, copper clips or other adaptive structures.

In addition, the power device package structure 200 provided in the present embodiment may further include a control system 224 (for example, including a control IC, a capacitor and other circuit devices) disposed on the block 202a of the first substrate 202, and an insulation layer (not shown) is disposed between the first substrate 202 and the control system 224, thereby electrically isolating the control system 224 from the first substrate 202 (i.e., the block 202a) thereunder. The control IC in the control system 224 may be electrically connected respectively with the power transistors 206a to 206d on the first substrate 202 via wires (not shown) and be configured to transmit a control signal to the power transistors 206a to 206d.

Continuously referring to FIG. 2B, in the present embodiment, the second substrate 204 is disposed under the first substrate 202, and the first substrate 202 may be in direct contact with the second substrate 204. In the present embodiment, the second substrate 204 has three blocks 204a, 204b and 204c, the block 204a is disposed directly under the power transistors 206a and 206b illustrated in FIG. 3, the block 204b is disposed directly under the power transistors 206c and 206d illustrated in FIG. 3, and the block 204c is disposed directly under the control system 224 illustrated in FIG. 3, but the disclosure is not limited thereto. For reducing the transient-state thermal resistance, it is sufficient that the second substrate 204 is disposed directly under the power device 206. In other words, the block 204c may be omitted. In FIG. 2B, a part of the second substrate 204 is exposed from the package 208, and a projection area of the second substrate 204 is not greater than that of the package 208. The selection of a material of the second substrate 204 may refer to the previous embodiment and thus, will not repeatedly described. The package 208 encapsulates the power device 206, the first substrate 202 and the second substrate 104 by a molding process, for example. In the present embodiment, a material of the package 208 may include an epoxy resin, a silicone resin, an unsaturated polyester or a ceramic material.

After a high current from the reference ground pins 210a and 210b or from the phase output pins 212a and 212b enters the power transistors 206a to 206d via the first substrate 202, a high junction temperature caused by the high heat transiently generated by the power transistors 206a to 206d may be reduced via the second substrate 204 having the high heat capacity in the present embodiment. Thus, the design of the present embodiment may protect the power device package structure 200 from being damaged.

In order to testify the aforementioned effect, experiments are provided below for description, but the experiments constitute no limitations to the disclosure.

Experimental Example

A power device package structure as illustrated in FIG. 2A and FIG. 2B is manufactured. Then, according to the ISO-7637-2 standard, a load dump test was performed based on test conditions listed in Table 1 and Table 2 below. After the test has been performed for 5 times with an interval of 60 seconds between each test, a load dump endurance result obtained after the test are shown in Table 3 below and FIG. 4.

Comparative Example

The comparative example and the experiment example are different in that the second substrate was not disposed in the power device package structure of the comparative example. Then, the load dump test was performed in the same way, and a result is shown in Table 3 below and FIG. 4.

TABLE 1

| Parameter | 12 System | 24 System |
|---|---|---|
| Pulse Voltage $U_S$ | 79 V to 101 V | 151 V to 202 V |
| Supply Voltage $U_A$ | 13.5 V | 27 V |
| Internal Resistance $R_i$ | 0.5Ω to 4Ω | 1Ω to 8Ω |
| Pulse Voltage with Load Dump Suppression $U_S^*$ | 35 | 65 |
| Pulse Width $t_d$ | 40 ms to 400 ms | 100 ms to 350 ms |
| Rise Time $t_r$ | 5 ms to 10 ms | 5 ms to 10 ms |

TABLE 2

| Transient Voltage Suppression (TVS) Method | | Low bond | Up bond |
|---|---|---|---|
| Pulse Voltage $U_S$ | V | 79 | 101 |
| Output Resistance $R_i$ | Ω | 0.5 | 4.0 |
| Device Under Test $V_{WM}$ (DUT $V_{WM}$) $V_{WM, DUT}$ | V | 24.0 | 24.0 |
| Peak Current $I_{peak}$ | A | 158.0 | 25.3 |
| Peak Power on DUT $P_{peak, DUT}$ | W | 3,792 | 606 |
| Pulse Width $t_d$ | ms | 30 | 321 |
| Load Dump Energy $E_{Load, Dump}$ | J | 56.6 | 97.2 |

TABLE 3

| | Experiment Example | Comparative Example |
|---|---|---|
| Heat Capacity (J/° C.) | 2.5 | 1.0 |
| Load Dump Energy (J) | 84.0 | 84.0 |
| Temperature Rise (° C.) | 171 | 278 |
| Center Temperature of Power Device $T_j$(° C.) | 193 | 300 |

Figure 4:
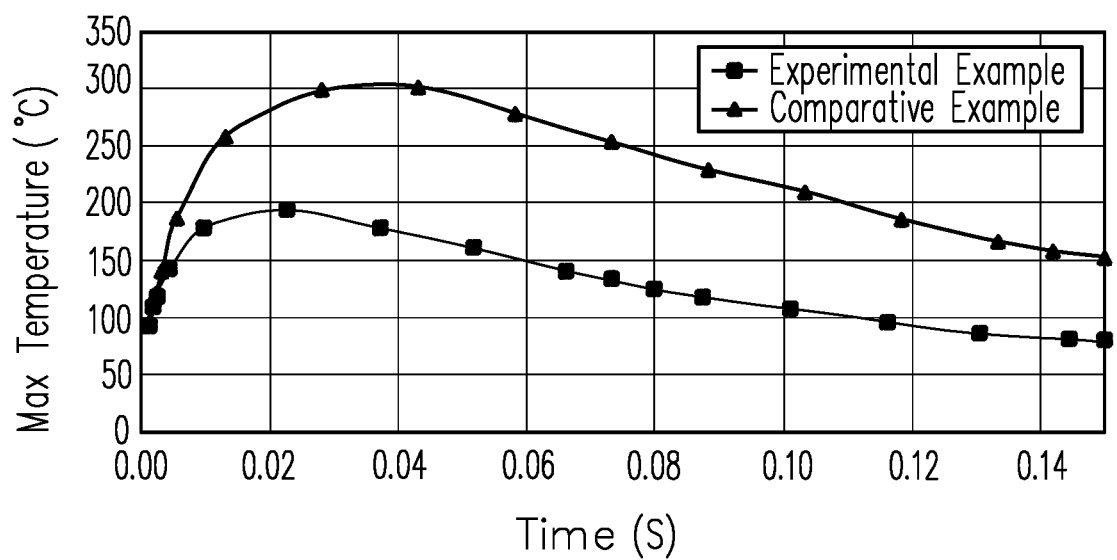
FIG. 4 is a graph showing load dump test results of an experiment example and a comparative example.

According to the test results shown in Table 3 and FIG. 4, because the power device package structure of the experiment example is disposed with the second substrate having the heat capacity, when the same load dump energy is applied, the temperature rise of the experiment example is much lower than that of the comparative example, and the junction temperature of the power device of the experiment example is also much lower than that of the comparative example. Accordingly, with the second substrate having the high heat capacity disposed under the first substrate in the disclosure, the transient-state thermal resistance of the power device package structure can be indeed reduced, which are reflected in the obvious improvement of the temperature rise and the junction temperature of the power device.

Based on the above, in the disclosure, as the power device package structure of the disclosure is provided with the second substrate having the greater heat capacity arranged in pairs with the first substrate having the great thermal conductivity, an effect of reducing not only the steady-state thermal resistance but also the transient-state thermal resistance can be achieved. Therefore, the power device package structure of the disclosure can be applied to a rectifier or a motor drive apparatus of a high-power vehicle generator.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power device package structure, comprising:
   a first substrate, having a heat conductivity greater than 200 $Wm^{-1}K^{-1}$, wherein a material of the first substrate is consisted of copper, aluminum, gold, silver, diamond, graphene, or an alloy compound thereof;
   at least one power device, disposed on the first substrate and being in physical and electrical contact with the first substrate;
   a second substrate, disposed under the first substrate, wherein a material of the second substrate is consisted of aluminum or an aluminum alloy, a heat capacity of the second substrate is greater than a heat capacity of the first substrate, and a volume of the second substrate is greater than a volume of the first substrate, the first substrate and the second substrate are homogeneous materials; and
   a package, encapsulating the first substrate, the second substrate, and the power device, wherein a part of the first substrate and a part of the second substrate are exposed from the package.

2. The power device package structure according to claim 1, wherein a thickness of the second substrate is greater than a thickness of the first substrate.

3. The power device package structure according to claim 1, wherein a projection area of the second substrate is smaller than or equal to a projection area of the package.

4. The power device package structure according to claim 1, wherein the first substrate is made of copper and has a heat capacity greater than or equal to 0.5 $J\cdot°C.^{-1}$.

5. The power device package structure according to claim 4, wherein the second substrate has a heat capacity greater than or equal to 1.43 $J\cdot°C.^{-1}$.

6. The power device package structure according to claim 1, wherein the second substrate is disposed directly under the power device.

7. The power device package structure according to claim 1, wherein the first substrate is in direct contact with the second substrate.

8. The power device package structure according to claim 1, which is a package structure for vehicle power device.

9. The power device package structure according to claim 1, further comprising a control IC or a circuit device disposed on the first substrate.

* * * * *